(12) United States Patent
Milkov

(10) Patent No.: US 7,795,977 B2
(45) Date of Patent: Sep. 14, 2010

(54) BOOTSTRAPPED CLASS AB CMOS OUTPUT STAGE

(75) Inventor: Mihail Milkov, Camarillo, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 14 days.

(21) Appl. No.: 12/166,214

(22) Filed: Jul. 1, 2008

(65) Prior Publication Data

US 2010/0001800 A1  Jan. 7, 2010

(51) Int. Cl.
*H03F 3/18* (2006.01)
(52) U.S. Cl. .................. 330/264; 330/302; 330/156; 330/9
(58) Field of Classification Search ............ 330/264, 330/302, 156, 9
See application file for complete search history.

(56) References Cited

U.S. PATENT DOCUMENTS

| | | | | |
|---|---|---|---|---|
| 4,531,101 A | * | 7/1985 | Pecukonis | .......... 330/302 |
| 5,434,544 A | * | 7/1995 | Van Veenendaal | ...... 331/117 R |
| 6,154,092 A | * | 11/2000 | Lee et al. | ............... 330/51 |
| 6,630,863 B2 | * | 10/2003 | Tsuchiya | .................. 330/254 |
| 7,239,201 B2 | * | 7/2007 | Woodford | .................. 330/10 |
| 2008/0150866 A1 | * | 6/2008 | Maki | ...................... 345/89 |

* cited by examiner

*Primary Examiner*—Patricia Nguyen
(74) *Attorney, Agent, or Firm*—Koppel, Patrick, Heybl & Dawson

(57) ABSTRACT

A bootstrapped class AB CMOS output circuit and method for generating a class AB output are disclosed. The bootstrapped class AB CMOS output circuit has a voltage offset circuit coupled to an NMOS transistor and a PMOS transistor. The voltage offset circuit has a capacitor bootstrapped between the NMOS transistor and the PMOS transistor to establish a voltage offset between the NMOS transistor and the PMOS transistor to effect a class AB output. The method for generating a class AB output in a semiconductor device having a capacitor coupled to the NMOS transistor and the PMOS transistor includes providing a voltage offset across the capacitor to effect a class AB output.

14 Claims, 7 Drawing Sheets

BOOTSTRAPPED CLASS AB CMOS OUTPUT STAGE

BACKGROUND

This disclosure relates to a class AB CMOS output stage. More particularly, the invention relates to a bootstrapped class AB CMOS output circuit and method for generating a class AB output.

SUMMARY

A bootstrapped class AB CMOS output circuit and method for generating a class AB output are disclosed. The bootstrapped class AB CMOS output circuit has a CMOS circuit and a voltage offset circuit. The CMOS circuit may include an NMOS transistor and a PMOS transistor. The voltage offset circuit may include a capacitor that couples the gate of the NMOS transistor to the gate of the PMOS transistor and establishes a voltage offset between the gate of the NMOS transistor and the gate of the PMOS transistor to effect a class AB output.

In one embodiment, the voltage offset circuit may also include a voltage bias, a reset switch, a first node, a second node and an input voltage. The voltage bias may be used to provide a voltage bias supply to the PMOS transistor. The reset switch controls the voltage bias supplied to the PMOS transistor and sampled on the capacitor. The first node couples the reset switch to the PMOS transistor and the capacitor. The second node couples the input voltage to the capacitor and the NMOS transistor. The input voltage applies a voltage to the NMOS transistor and the capacitor. In another embodiment, the voltage bias may be used to provide a voltage bias supply to the NMOS transistor. The reset switch controls the voltage bias supplied to the NMOS transistor and sampled on the capacitor, while the first node couples the reset switch to the NMOS transistor and the capacitor.

The bootstrapped class AB CMOS output circuit may include a P-cascode or N-cascode coupled to the NMOS transistor and the PMOS transistor. The P-cascode or N-cascode may be used to increase the gain and improve the efficiency of the class AB output.

In one embodiment, the method for generating a class AB output in a semiconductor device may include applying, in a reset phase, a voltage bias at the first node to bias the PMOS transistor and sample the voltage bias on the capacitor. Next, in an amplification phase, the voltage bias is disconnected. The input voltage is then supplied at the second node to the NMOS transistor and the capacitor. The capacitor couples a voltage change from the second node to the first node to modulate the PMOS bias current and establish a class AB current control. The circuit alternates between the reset phase and the amplification phase to establish the voltage offset between the gate of the NMOS transistor and the gate of the PMOS transistor.

DRAWINGS

The above-mentioned features and objects of the present disclosure will become more apparent with reference to the following description taken in conjunction with the accompanying drawings wherein like reference numerals denote like elements and in which.

DETAILED DESCRIPTION

In the description that follows, the present invention will be described in reference to a preferred embodiment that provides bootstrapped class AB CMOS output stage. The present invention, however, is not limited to any particular application nor is it limited by the examples described herein. Therefore, the description of the embodiments that follow are for purposes of illustration and not limitation.

A class AB CMOS output circuit may be a push-pull output stage with a PMOS transistor and an NMOS transistor. The class AB CMOS output circuit is biased such that a quiescent current $I_Q$ is not equal to zero. The quiescent current $I_Q$ occurs when there is no load current ($I_L=0$) in the circuit, that is, when the NMOS current $I_N$ is equal to and offsets the PMOS current $I_P$.

Figure 1:
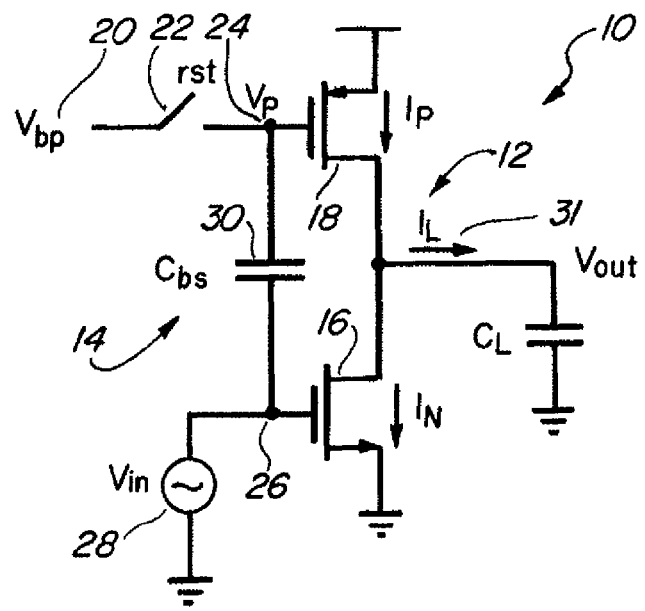
FIG. 1 is a bootstrapped class AB CMOS output circuit with an input voltage applied to an NMOS transistor, according to one embodiment of the present disclosure.

FIG. 1 is a bootstrapped class AB CMOS output circuit 10, according to one embodiment of the present disclosure. The class AB CMOS output circuit 10 may include a CMOS circuit 12 and a voltage offset circuit 14. The CMOS circuit 12 may include an NMOS transistor 16 and a PMOS transistor 18. The voltage offset circuit 14 may include a voltage bias 20, a reset switch 22, a first node 24, a second node 26, an input voltage 28 and a capacitor 30.

The voltage bias 20 may be used to provide a voltage bias supply to the PMOS transistor 18. The reset switch 22 may be used to control a sampling of the voltage bias 20 on the capacitor 30. The first node 24 may be used to couple the reset switch 22 to the PMOS transistor 18 and the capacitor 30. The second node 26 may be used to couple the input voltage 28 to the capacitor 30 and the NMOS transistor 16. The input voltage 28 may be applied to the NMOS transistor 16 and the capacitor 30. The capacitor 30 may be bootstrapped between the NMOS transistor 16 and the PMOS transistor 18 to establish a voltage offset between the NMOS transistor 16 and the PMOS transistor 18 to effect a class AB output.

In one embodiment, the voltage offset circuit 14 may be configured to alternate between a reset phase and an amplification phase to establish the voltage offset between a gate of the NMOS transistor 16 and a gate of the PMOS transistor 18. For example, the voltage offset circuit 14 may include a controller (not shown) to alternate between the reset phase and the amplification phase to establish the voltage offset between the NMOS transistor 16 and the PMOS transistor 18.

Figure 2:
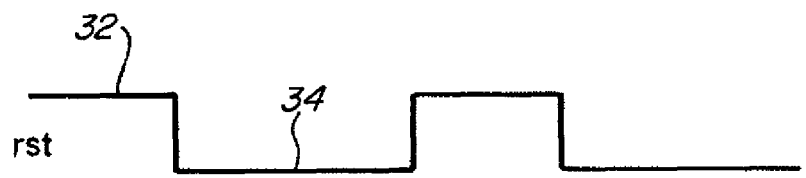
FIG. 2 illustrates a timing diagram of the reset switch for the bootstrapped class AB CMOS output circuit of FIG. 1, according to one embodiment of the present disclosure.

FIG. 2 illustrates a timing diagram of the reset switch 22 for the bootstrapped class AB CMOS output circuit 10 of FIG. 1. In one embodiment, the reset switch 22 is closed to begin the reset phase and is opened to begin the amplification phase. When the reset switch 22 is closed 32, the first node 24 may be precharged by the voltage bias 20 to define the quiescent bias current $I_Q$ flowing in the circuit 10. When the reset switch 22 is opened 34, the first node 24 is floating such that any change in the input voltage 28 applied to the second node 26 will cause a change in the first node 24 voltage.

Figure 3:
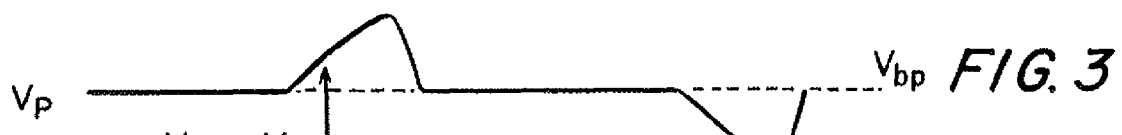
FIG. 3 illustrates the voltage at node 24 of the bootstrapped class AB CMOS output circuit of FIG. 1, according to one embodiment of the present disclosure.
Figure 4:
FIG. 4 illustrates the voltage at node 26 of the bootstrapped class AB CMOS output circuit of FIG. 1, according to one embodiment of the present disclosure.
Figure 5:
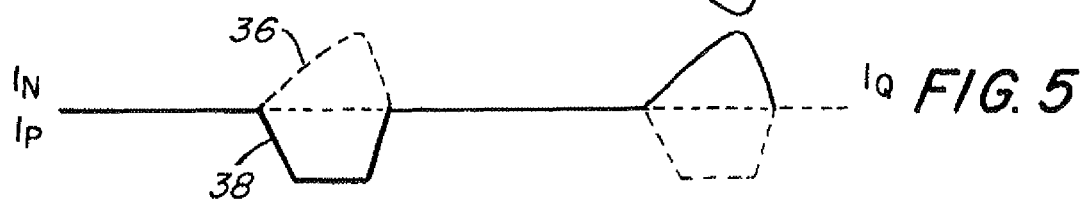
FIG. 5 illustrates the current for the NMOS and PMOS transistors of the bootstrapped class AB CMOS output circuit of FIG. 1, according to one embodiment of the present disclosure.

FIG. 3 illustrates the PMOS bias voltage at node 24 in response to the input voltage 28 of FIG. 4. The dotted lines $V_{bp}$ and $V_{bn}$ are the PMOS bias voltage and the input voltage, respectively, during the reset phase. FIG. 5 illustrates the NMOS current 36 and the PMOS current 38 in response to the input voltage 28 of FIG. 4. The dotted line is the quiescent current $I_Q$, which is the current flowing through the NMOS and PMOS transistors during the reset phase. As shown in FIGS. 3-5, as the input voltage 28 increases above $V_{bn}$ during the amplification phase, the PMOS bias voltage at the first node 24 increases, the NMOS current 36 increases above $I_Q$ and the PMOS current 38 decreases below $I_Q$. Thus, for a positive input step, the output makes a negative transition and current $|I_L|=I_N-I_P$, which is more than the quiescent current $I_Q$ is available to discharge the load capacitor $C_L$. Conversely, when the input voltage 28 decreases below $V_{bn}$ during the amplification phase, the PMOS bias voltage at first node 24 decreases, the NMOS current 36 decreases below $I_Q$, and the PMOS current 38 increases above $I_Q$. Thus, for a negative input step, the output makes a positive transition and current $I_L=I_P-I_N$, which is more than the quiescent current $I_Q$ is available to charge up the load capacitor $C_L$. The availability of load current $|I_L|$ exceeding the quiescent current during either a positive or negative input step confirms the class AB nature of this circuit. The bootstrapped capacitor 30 establishes a voltage difference between the NMOS transistor 16 and the PMOS transistor 18 to effect a class AB output.

Figure 6:
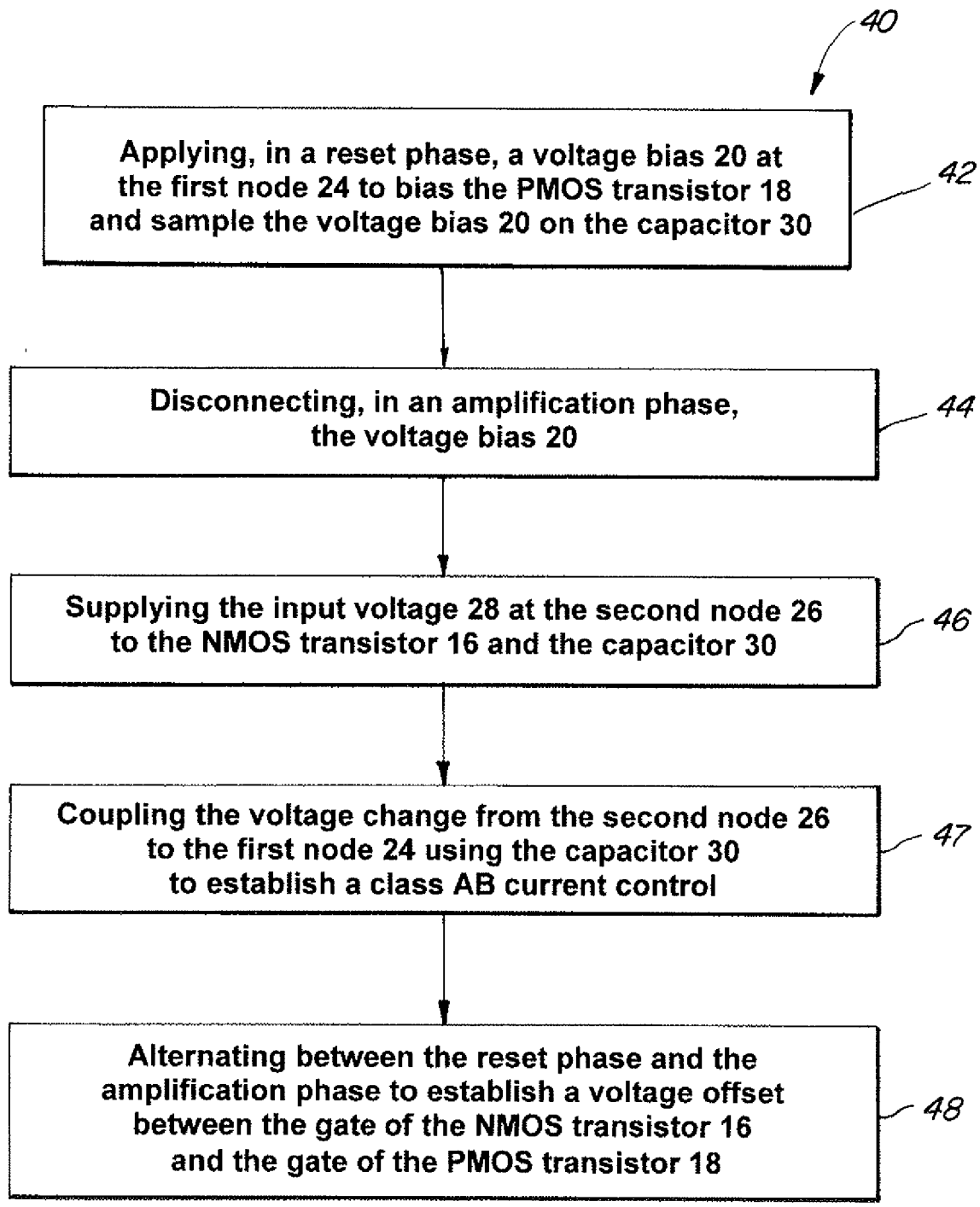
FIG. 6 is an exemplary flow chart outlining the operation of the bootstrapped class AB CMOS output circuit of FIG. 1, according to one embodiment of the present disclosure.

FIG. 6 is an exemplary flow chart 40 outlining the operation of the bootstrapped class AB CMOS output circuit 10 of FIG. 1, according to an embodiment of the present disclosure. The method may begin by applying, in a reset phase, a voltage bias 20 at the first node 24 to bias the PMOS transistor 18 and sample the voltage bias 20 on the capacitor 30 (42). Next, in an amplification phase, the voltage bias 20 is disconnected (44). The input voltage 28 is then supplied at the second node 26 to the NMOS transistor 16 and the capacitor 30 (46). The capacitor 30 couples a voltage change on the first node 24 to the second node 26 to establish a voltage offset between the NMOS transistor 16 and the PMOS transistor 18, thus modulating the PMOS bias current and establishing a class AB current control (47). Then, alternating between the reset phase and the amplification phase to establish the voltage offset between the gate of the NMOS transistor 16 and the gate of the PMOS transistor 18 (48).

Figure 7:
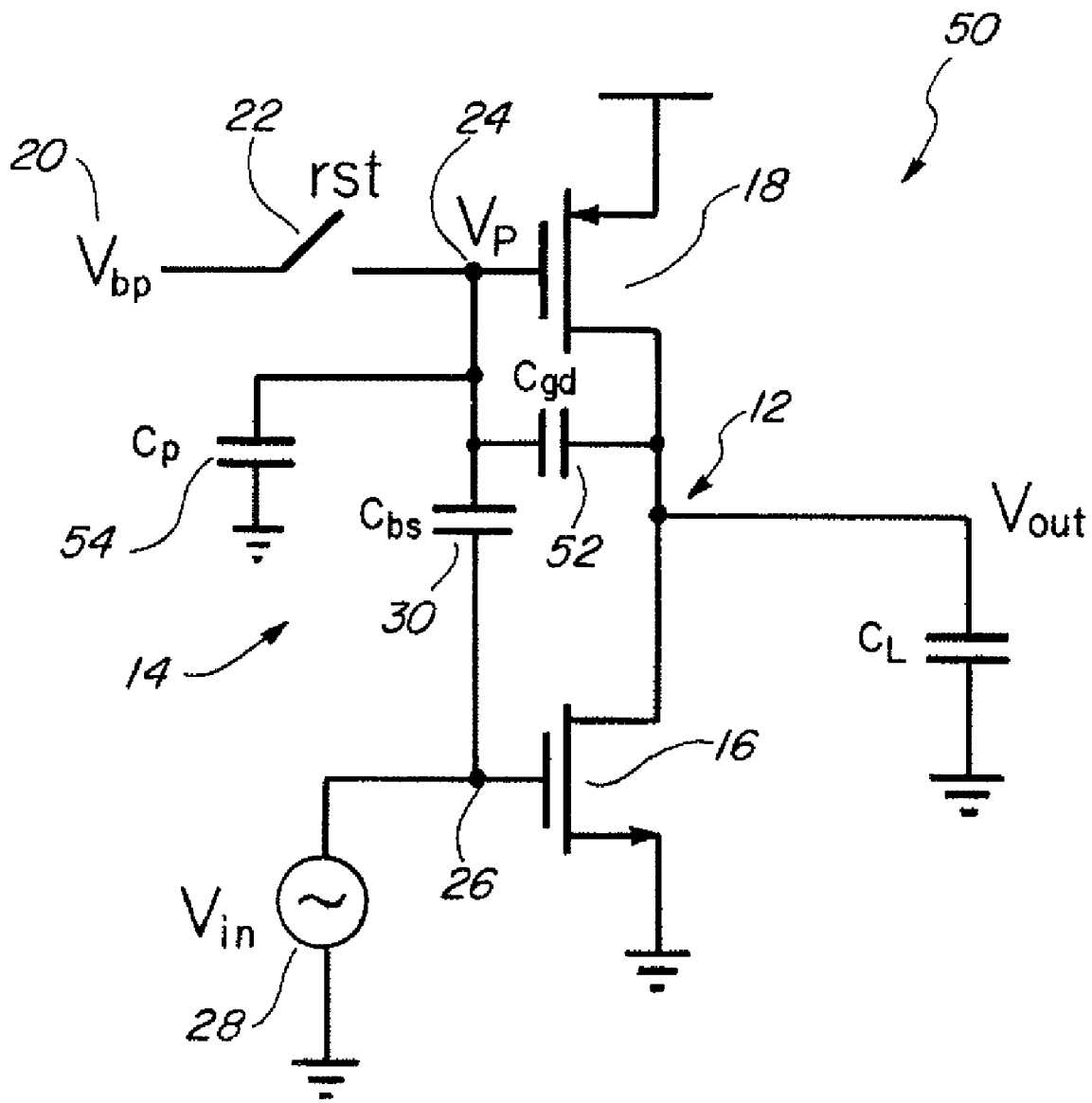
FIG. 7 illustrates gate-to-drain capacitance and parasitic capacitance on a bootstrapped class AB CMOS output circuit, according to one embodiment of the present disclosure.

FIG. 7 illustrates the gate-to-drain capacitance 52 of the PMOS transistor 18 and parasitic capacitance 54 at node 24 of a bootstrapped class AB CMOS output circuit 50, according to an embodiment of the present disclosure. With gate-to-drain capacitance 52 and parasitic capacitance 54, the change in PMOS bias voltage during the amplification phase may be determined by the equation:

$$\Delta V_p = \frac{C_{bs} - |A_v|C_{gd}}{C_{bs} + C_p + C_{gd}} \Delta V_{in} \qquad (1)$$

where, $\Delta V_p$ is a change in the PMOS bias voltage, $\Delta V_{in}$ is a change in input voltage, $C_{bs}$ is the capacitance of the capacitor in the voltage offset circuit, $C_{gd}$ is a gate-to-drain capacitance of the PMOS transistor in the voltage offset circuit, $C_p$ is a parasitic capacitance from the first node in the voltage offset circuit to ground, and $A_v$ is a voltage gain of the class AB output stage and is equal to $\Delta V_{out}/\Delta V_{in}$.

As is appreciated from equation (1), when $C_p$ and $C_{gd}$ are equal to zero, the equation reduces to $\Delta V_p = \Delta V_{in}$. If there is $C_{gd}$ and/or $C_p$ in the circuit, then $\Delta V_p < \Delta V_{in}$.

In one embodiment, the bootstrapped class AB output may be determined by the equation:

$$\Delta V_{out} = -(g_{mN}\Delta V_{in} + g_{mP}\Delta V_p)(r_{oN}\|r_{oP}) \qquad (2)$$

where, $\Delta V_{out}$ is a small-signal voltage output, $\Delta V_p$ is a small-signal change in the PMOS bias voltage, $\Delta V_{in}$ is a small-signal change in input voltage, $g_{mN}$ is an equivalent transconductance for the NMOS transistor, $g_{mP}$ is an equivalent transconductance for the PMOS transistor, $r_{oN}$ is an output resistance of the NMOS transistor, and $r_{oP}$ is an output resistance of the PMOS transistor.

Equation (2) shows that, for the same small-signal input $\Delta V_{in}$ and for $\Delta V_p > 0$, $|\Delta V_{out}|$ of the bootstrapped class AB circuit is larger than $|\Delta V_{out}|$ of a class A output stage, given by $|\Delta V_{out}| = g_{mN}(r_{oN}\|r_{oP})\Delta V_{in}$.

Figure 8:
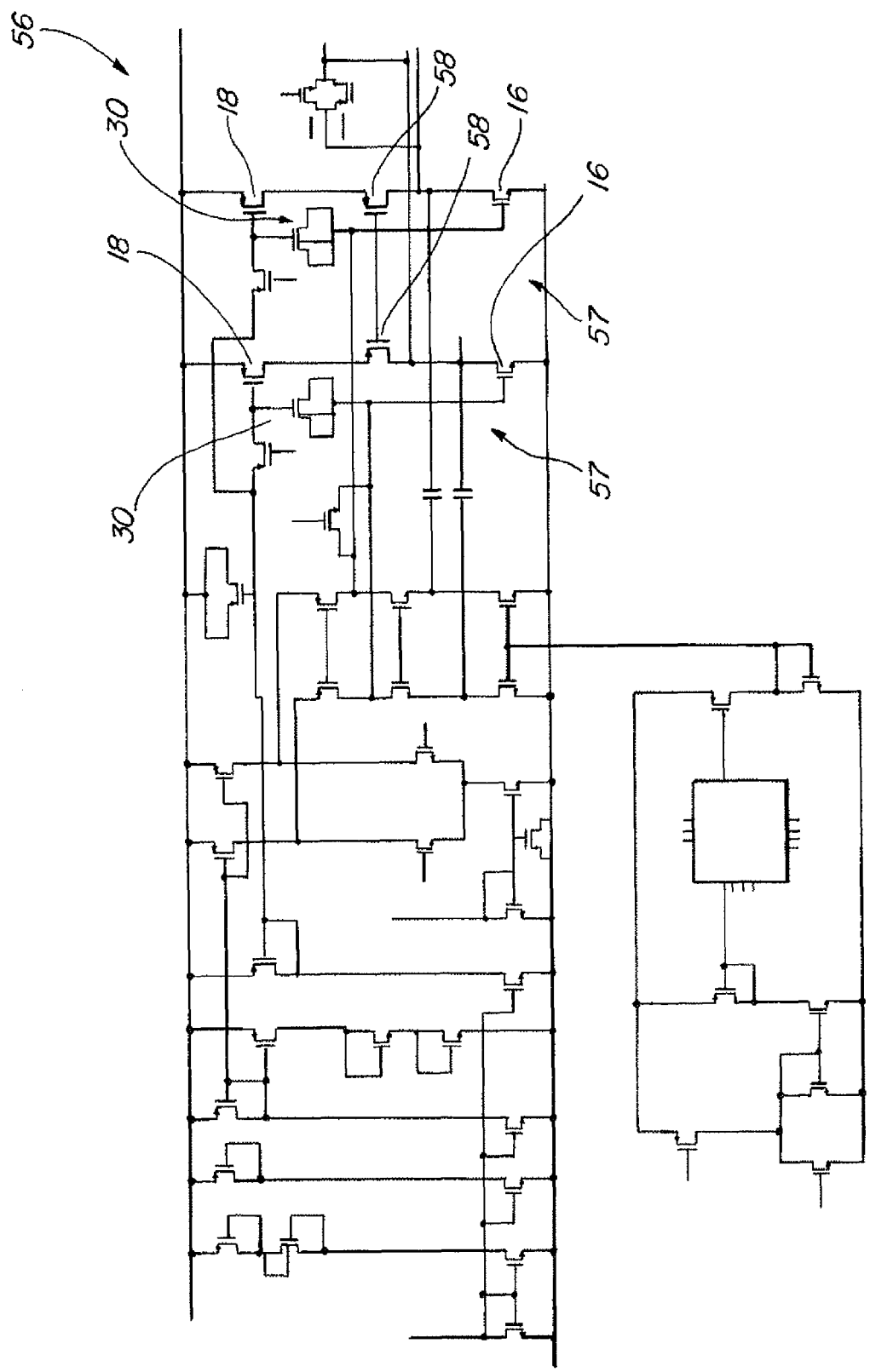
FIG. 8 is a fully-differential operational amplifier with bootstrapped class AB CMOS output circuit, according to one embodiment of the present disclosure.

FIG. 8 is a fully-differential operational amplifier 56 with bootstrapped class AB CMOS output circuit 57, according to one embodiment of the present disclosure. As shown in FIG. 8, the fully-differential operational amplifier 56 may include two bootstrapped class AB CMOS output circuits 57. In one embodiment, the capacitors 30 may be implemented as MOS caps to save layout area. The one or more bootstrapped class AB CMOS output circuits 57 may include a P-cascode 58 coupled to the NMOS transistor 16 and the PMOS transistor 18. The P-cascode 58 may be used to increase the gain and improve the efficiency of the class AB output. In another embodiment, the one or more bootstrapped class AB CMOS output circuits 57 may include an N-cascode (not shown) coupled to the NMOS transistor 16 and the PMOS transistor 18. The N-cascode may also be used to increase the gain and improve the efficiency of the class AB output.

Figure 9:
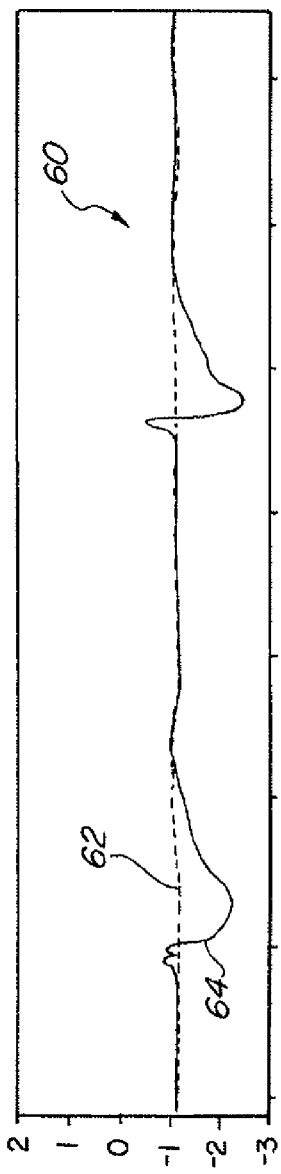
FIG. 9 illustrates a PMOS current at the positive output for the differential operational amplifier of FIG. 8, according to one embodiment of the present disclosure.
Figure 10:
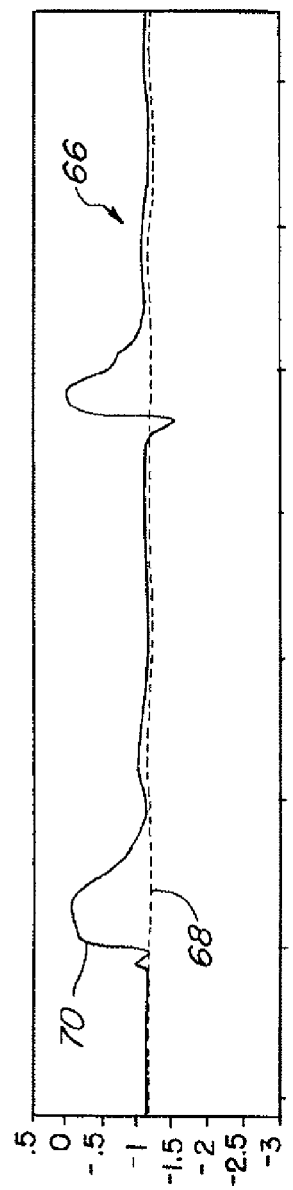
FIG. 10 illustrates a PMOS current at the negative output for the differential operational amplifier of FIG. 8, according to one embodiment of the present disclosure.
Figure 11:
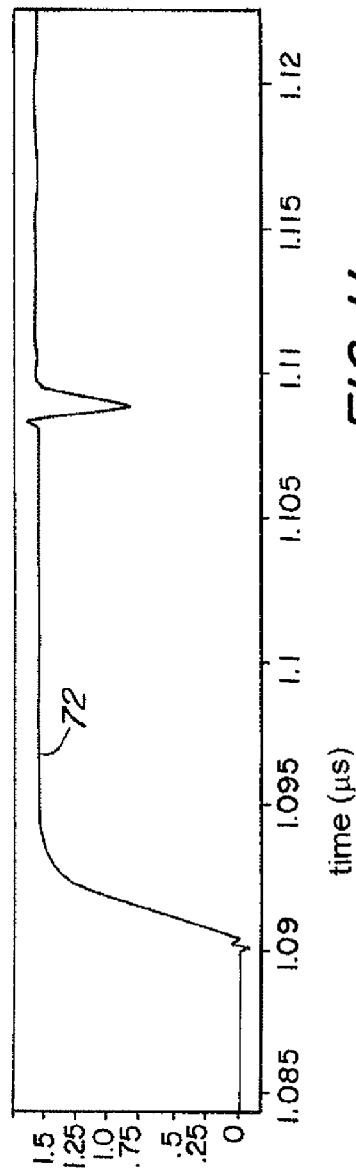
FIG. 11 illustrates a differential output voltage for the operational amplifier of FIG. 8, according to one embodiment of the present disclosure.

FIGS. 9 and 10 illustrate the modulation of the PMOS currents at the positive 60 and negative 66 amplifier outputs, respectively, for the operational amplifier 56 of FIG. 8, according to one embodiment of the present disclosure. The differential output voltage 72 of the operational amplifier makes a positive transition, as illustrated in FIG. 11. Curves 64 and 70 illustrate a bootstrapped class AB output current. Curves 62 and 68 illustrate a class A output current for reference. As shown in FIGS. 9 and 10, there is no modulation of the PMOS bias current for class A output. In contrast, for a bootstrapped class AB output, a positive step in the differential output 72 leads to an increase (in absolute value) of the PMOS current 64 at the positive output 60 and a simultaneous decrease in the PMOS current 70 at the negative output 66. This is consistent with the fact that the positive amplifier output is slewing up (its PMOS drive transistor is sourcing current into the load capacitor), while the negative amplifier output is stewing down (its NMOS drive transistor is sinking current from the load capacitor, while the PMOS transistor is essentially turned off).

Figure 12:
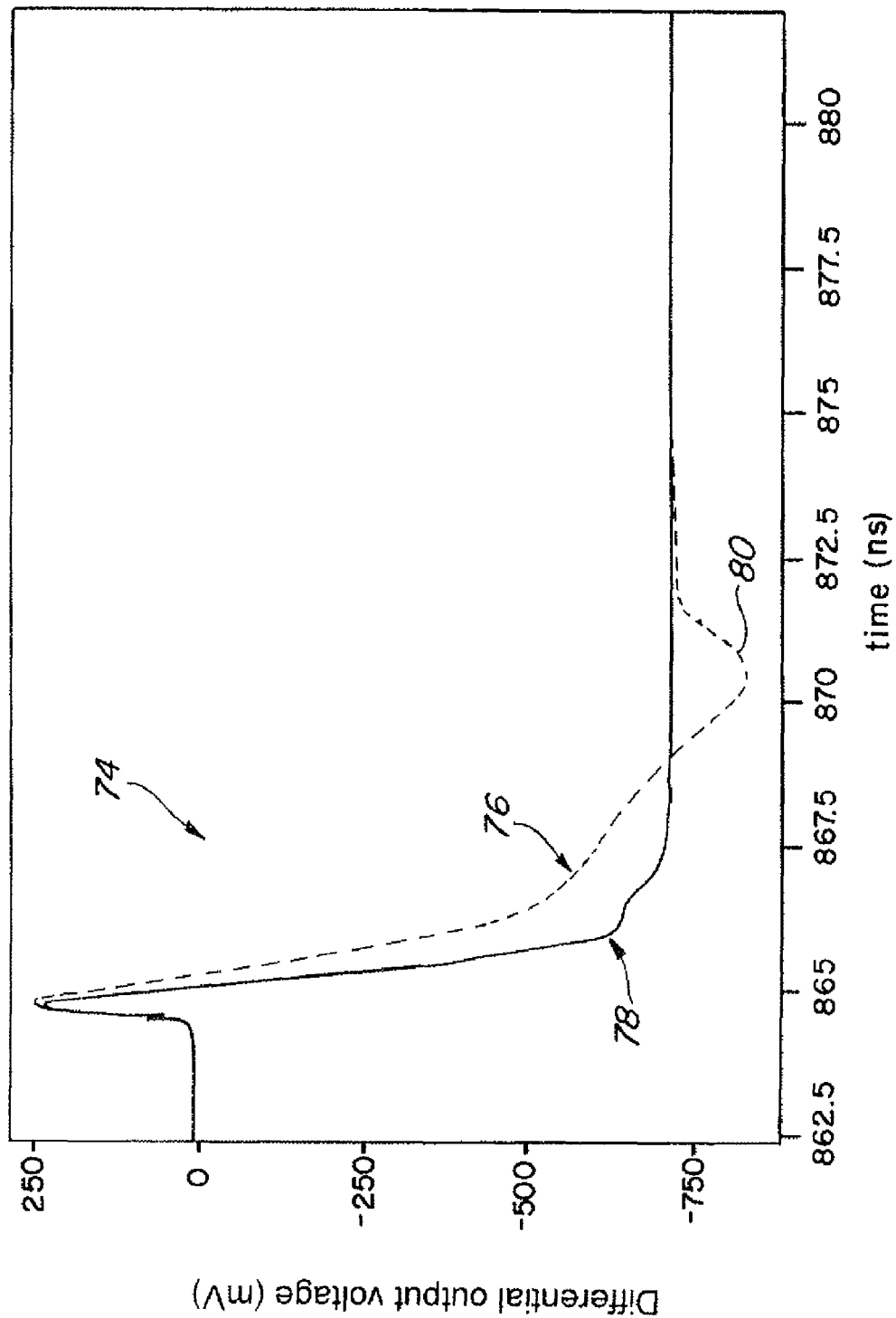
FIG. 12 illustrates a differential output voltage for the operational amplifier of FIG. 8 with class A output and with bootstrapped class AB output, according to one embodiment of the present disclosure.

FIG. 12 illustrates the differential output voltage 74 for the operational amplifier 56 of FIG. 8, according to one embodiment of the present disclosure. Curve 76 illustrates a class A output voltage (for reference) and curve 78 illustrates a bootstrapped class AB output voltage. As shown in FIG. 12, curve 78 for the class AB output has a steeper slope and less overshoot indicating faster settling time than curve 76 for the class A output. The steeper slope may be explained by the modulation of the output drive current as illustrated in FIGS. 9 and 10. The reduced overshoot may be due to the increased small-signal gain of the bootstrapped class AB stage in comparison to a class A stage, as predicted by equation (2). Having more gain in the second stage of a Miller-compensated two-stage amplifier may be used to increase its stability leading to less overshoot.

As can be appreciated by a person skilled in the art, the bootstrapped class AB CMOS output circuit of the present disclosure may be used to provide large drive current (during slewing) while having low quiescent current $I_Q$. This results in power efficiency, smaller output device size, lower device capacitance and faster settling. Furthermore, as can be appreciated by a person skilled in the art, the bootstrapped class AB CMOS output circuit of the present disclosure is simple to implement, requiring one capacitor and one switch. The bootstrapped class AB CMOS output circuit may be used to provide well-defined quiescent current $I_Q$ and can accept large input swings while maintaining the AB current control. Additionally, the class AB control consumes no additional bias current and improves amplifier stability.

Figure 13:
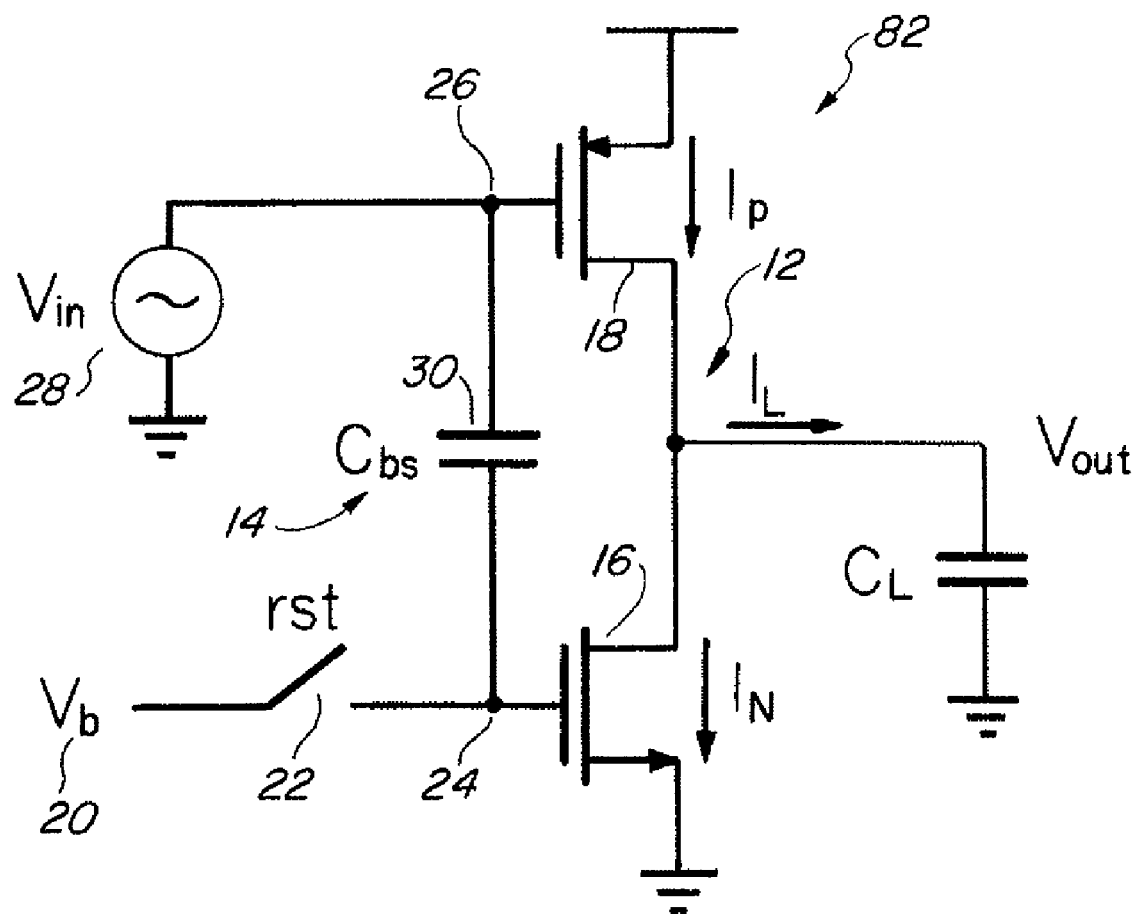
FIG. 13 is a bootstrapped class AB CMOS output circuit with an input voltage applied to the PMOS transistor according to one embodiment of the present disclosure.

It is understood that various configurations of the bootstrapped class AB CMOS output circuit may be utilized to provide a class AB output. For example, as shown in FIG. 13, the bootstrapped class AB CMOS output circuit 82 may have the voltage bias 20 providing a voltage bias supply to the NMOS transistor 16 (instead of the PMOS transistor 18) and may be controlled by the reset switch 22. The first node 24 couples the reset switch 22 to the NMOS transistor 16 and the capacitor 30. The input voltage is applied to node 26, which is the gate of the PMOS transistor 18 (instead of the NMOS transistor 16).

While the system and method for generating a class AB output using a bootstrapped class AB CMOS output circuit have been described in terms of what are presently considered to be the most practical and preferred embodiments, it is to be understood that the disclosure need not be limited to the disclosed embodiments. It should also be understood that a variety of changes may be made without departing from the essence of the invention. Such changes are also implicitly included in the description. They still fall within the scope of this disclosure. It should be understood that this disclosure is intended to yield a patent covering numerous aspects of the invention both independently and as an overall system and in both method and apparatus modes.

Further, each of the various elements of the invention and claims may also be achieved in a variety of manners. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled.

It should be understood that all actions may be expressed as a means for taking that action or as an element which causes that action. Similarly, each physical element disclosed should be understood to encompass a disclosure of the action which that physical element facilitates.

It should be understood that various modifications and similar arrangements are included within the spirit and scope of the claims, the scope of which should be accorded the broadest interpretation so as to encompass all such modifications and similar structures. The present disclosure includes any and all embodiments of the following claims.

The invention claimed is:

1. A class AB CMOS output circuit comprising:
a CMOS circuit comprising an NMOS transistor having a gate and a PMOS transistor having a gate; and
a voltage offset circuit comprising a capacitor that couples the gate of the NMOS transistor to the gate of the PMOS transistor and establishes a voltage offset between the gate of the NMOS transistor and the gate of the PMOS transistor to effect a class AB output, wherein the voltage offset circuit is configured to alternate between a reset phase and an amplification phase to establish the voltage offset between the gate of the NMOS transistor and the gate of the PMOS transistor.

2. The class AB CMOS output circuit of claim 1, wherein the voltage offset circuit further comprises a reset switch for controlling a voltage bias supplied to the PMOS transistor, and a first node for coupling the reset switch to the PMOS transistor and the capacitor.

3. The class AB CMOS output circuit of claim 2, wherein the voltage offset circuit further comprises a second node, wherein the capacitor is between the first node and the second node of the voltage offset circuit and an input voltage is applied to the second node.

4. The class AB CMOS output circuit of claim 1, wherein the voltage offset circuit further comprises a reset switch for controlling a voltage bias supplied to the NMOS transistor, and a first node for coupling the reset switch to the NMOS transistor and the capacitor.

5. A class AB CMOS output circuit comprising:
a CMOS circuit comprising an NMOS transistor having a gate and a PMOS transistor having a gate;
a voltage offset circuit comprising a capacitor that couples the gate of the NMOS transistor to the gate of the PMOS transistor and establishes a voltage offset between the gate of the NMOS transistor and the gate of the PMOS transistor to effect a class AB output, wherein the voltage offset circuit further comprises a reset switch for controlling a voltage bias supplied to the PMOS transistor, and a first node for coupling the reset switch to the PMOS transistor and the capacitor; and a P-cascode for increasing the gain of the class AB output and improving the efficiency of the class AB output, the P-cascode being coupled to the NMOS transistor and the PMOS transistor.

6. A class AB CMOS output circuit comprising:

a CMOS circuit comprising an NMOS transistor having a gate and a PMOS transistor having a gate;

a voltage offset circuit comprising a capacitor that couples the gate of the NMOS transistor to the gate of the PMOS transistor and establishes a voltage offset between the gate of the NMOS transistor and the gate of the PMOS transistor to effect a class AB output, wherein the voltage offset circuit further comprises a reset switch for controlling a voltage bias supplied to the NMOS transistor, and a first node for coupling the reset switch to the NMOS transistor and the capacitor; and an N-cascode for increasing the gain and improving the efficiency of the class AB output, the N-cascode being coupled to the NMOS transistor and the PMOS transistor.

7. A class AB CMOS output circuit comprising:

a CMOS circuit comprising an NMOS transistor having a gate and a PMOS transistor having a gate; and a voltage offset circuit comprising a capacitor that couples the gate of the NMOS transistor to the gate of the PMOS transistor and establishes a voltage offset between the gate of the NMOS transistor and the gate of the PMOS transistor to effect a class AB output, wherein the PMOS transistor has an associated PMOS bias voltage, with a change in the PMOS bias voltage determined by the equation:

$$\Delta V_p = \frac{C_{bs} - |A_v| C_{gd}}{C_{bs} + C_p + C_{gd}} \Delta V_{in}$$

where, $\Delta V_P$ is a change in the PMOS bias voltage, $\Delta V_{in}$ is a change in input voltage, $C_{bs}$ is the capacitance of the capacitor in the voltage offset circuit, $C_{gd}$ is a gate-to-drain capacitance of the PMOS transistor in the voltage offset circuit, $C_P$ is a parasitic capacitance from the first node in the voltage offset circuit to ground, and $A_v$ is a voltage gain of the class AB output stage.

8. A class AB CMOS output circuit comprising:

a CMOS circuit comprising an NMOS transistor having a gate and a PMOS transistor having a gate; and a voltage offset circuit comprising a capacitor that couples the gate of the NMOS transistor to the gate of the PMOS transistor and establishes a voltage offset between the gate of the NMOS transistor and the gate of the PMOS transistor to effect a class AB output, wherein the class AB output is determined by the equation:

$$\Delta V_{out} = -(g_{mN}\Delta V_{in} + g_{mP}\Delta V_p)(r_{oN} \| r_{oP})$$

where, $\Delta V_{out}$ is a small-signal voltage output, $\Delta V_P$ is a small-signal change in the PMOS bias voltage, $\Delta V_{in}$ is a small-signal change in input voltage, $g_{mN}$ is an equivalent transconductance for the NMOS transistor, $g_{mP}$ is an equivalent transconductance for the PMOS transistor, $r_{oN}$ is an output resistance of the NMOS transistor, and $r_{oP}$ is an output resistance of the PMOS transistor.

9. A semiconductor device having an NMOS transistor coupled to a PMOS transistor, the semiconductor device comprising:

a voltage offset circuit having a voltage bias, a reset switch, a first node, a second node, an input voltage and a capacitor, the voltage bias provides a voltage bias supply to the PMOS transistor, the reset switch controls a sampling of the voltage bias on the capacitor, the first node couples the reset switch to the PMOS transistor and the capacitor, the second node couples the input voltage to the capacitor and the NMOS transistor, the input voltage is applied to the NMOS transistor and the capacitor, the capacitor establishes a voltage offset between the NMOS transistor and the PMOS transistor to effect a class AB output; and a P-cascode for increasing the gain of the class AB output and improving the efficiency of the class AB output, the P-cascode being coupled to the NMOS transistor and the PMOS transistor.

10. A method for generating a class AB output in a semiconductor device having a CMOS circuit with an NMOS transistor coupled to a PMOS transistor, and a voltage offset circuit comprising a capacitor between a first node and a second node, the method comprising:

in a reset phase, applying a voltage bias at the first node to bias the PMOS transistor and sample the voltage bias on the capacitor;

in an amplification phase, disconnecting the voltage bias;

supplying an input voltage at the second node to the NMOS transistor and the capacitor to establish a class AB current control; and alternating between said reset phase and said amplification phase.

11. The method of claim 10, further comprising coupling a voltage change from the second node to the first node using the capacitor to establish a class AB current control.

12. A method for generating a class AB output in a semiconductor device having a CMOS circuit with an NMOS transistor coupled to a PMOS transistor, and a voltage offset circuit comprising a capacitor between a first node and a second node, the method comprising:

in a reset phase, applying a voltage bias at the first node to bias the NMOS transistor and sample the voltage bias on the capacitor;

in an amplification phase, disconnecting the voltage bias;

supplying an input voltage at the second node to the PMOS transistor and the capacitor;

establishing a voltage offset between the NMOS transistor and the PMOS transistor to effect a class AB current control; and alternating between said reset phase and said amplification phase.

13. A class AB CMOS output circuit comprising:

a first node;

a second node adapted to receive an input voltage;

a PMOS transistor having a gate connected to said first node;

an NMOS transistor having a gate connected to said second node, the drains of said PMOS and NMOS transistors connected together at a common node;

a capacitor coupled between said first and second nodes;

a reset switch which, when closed during a reset phase applies a voltage bias to said first node, and which disconnects said voltage bias from said first node when open during an amplification phase;

said circuit arranged to alternate between said reset and amplification phases so as to establish a voltage offset between the gate of said NMOS transistor and the gate of said PMOS transistor and thereby effect a class AB output.

14. A class AB CMOS output circuit comprising:
a first node;
a second node adapted to receive an input voltage;
an NMOS transistor having a gate connected to said first node;
a PMOS transistor having a gate connected to said second node, the drains of said PMOS and NMOS transistors connected together at a common node;
a capacitor coupled between said first and second nodes;
a reset switch which, when closed during a reset phase applies a voltage bias to said first node, and which disconnects said voltage bias from said first node when open during an amplification phase;
said circuit arranged to alternate between said reset and amplification phases so as to establish a voltage offset between the gate of said NMOS transistor and the gate of said PMOS transistor and thereby effect a class AB output.

* * * * *

UNITED STATES PATENT AND TRADEMARK OFFICE
CERTIFICATE OF CORRECTION

PATENT NO. : 7,795,977 B2  
APPLICATION NO. : 12/166214  
DATED : September 14, 2010  
INVENTOR(S) : Mihail Milkov Page 1 of 1

It is certified that error appears in the above-identified patent and that said Letters Patent is hereby corrected as shown below:

In the Specification

Column 1, Line 4, Insert the following paragraph before: "BACKGROUND"

--GOVERNMENT RIGHTS

This invention was made with Government support under contract number DAAB07-01-D-G601 awarded by the Department of Defense. The Government has certain rights in the invention.--

Signed and Sealed this  
Fourteenth Day of October, 2014

Michelle K. Lee  
*Deputy Director of the United States Patent and Trademark Office*